United States Patent [19]

Piro

[11] Patent Number: 5,670,294
[45] Date of Patent: Sep. 23, 1997

[54] AQUEOUS ALKALINE SOLUTION FOR DEVELOPING OFFSET PRINTING PLATES

[75] Inventor: Mario Piro, S. Donato, Italy

[73] Assignee: Imation Corp, Oakdale, Minn.

[21] Appl. No.: 705,009

[22] Filed: Aug. 29, 1996

Related U.S. Application Data

[63] Continuation of Ser. No. 577,056, Dec. 22, 1995, abandoned.

[30] Foreign Application Priority Data

Mar. 7, 1995 [EP] European Pat. Off. .............. 95103228

[51] Int. Cl.$^6$ .................................................. B03F 7/32
[52] U.S. Cl. .................... 430/169; 430/157; 430/165; 430/193; 430/302; 430/331
[58] Field of Search ........................... 430/169, 302, 430/331, 165, 175, 176, 192, 193, 157, 189

[56] References Cited

U.S. PATENT DOCUMENTS

| | | | |
|---|---|---|---|
| 4,130,425 | 12/1978 | Boyd ........................................ | 430/331 |
| 4,374,920 | 2/1983 | Wanat et al. ........................... | 430/331 |
| 4,452,880 | 6/1984 | Seino et al. ........................ | 430/331 X |
| 4,500,625 | 2/1985 | Kita et al. .............................. | 430/302 |
| 4,576,743 | 3/1986 | Kita et al. ............................ | 430/331 X |
| 4,576,903 | 3/1986 | Baron et al. ........................... | 430/331 |
| 4,606,995 | 8/1986 | Kita et al. .............................. | 430/302 |
| 4,945,030 | 7/1990 | Turner et al. .......................... | 430/331 |
| 5,051,327 | 9/1991 | Osawa et al. .......................... | 430/302 |
| 5,155,011 | 10/1992 | Zertani et al. ......................... | 430/331 |
| 5,480,762 | 1/1996 | Toyama et al. ........................ | 430/331 |
| 5,532,116 | 7/1996 | Suzuki et al. .......................... | 430/302 |

FOREIGN PATENT DOCUMENTS

| | | |
|---|---|---|
| 0 272 686 | 12/1987 | European Pat. Off. . |
| 50-051324 | 5/1975 | Japan . |
| 55095946 | 1/1979 | Japan . |
| 56142528 | 4/1980 | Japan . |
| 63-205658 | 8/1988 | Japan . |
| 3-38647 | 5/1991 | Japan . |

*Primary Examiner*—John S. Chu
*Attorney, Agent, or Firm*—Mark A. Litman

[57] ABSTRACT

The present invention relates to an aqueous alkaline developing solution comprising an alkaline mixture of an alkali metal silicate and/or an alkali metal metasilicate, wherein the $M_2O/SiO_2$ molar ratio of said alkaline mixture is in the range of from 0.5 to 1.2, the total content of said alkaline mixture being in the range of from 6 to 15% by weight of the total developing solution, and wherein said developing solution comprises a non-ionic surfactant and at least another surfactant selected from the group consisting of anionic surfactants and amphoteric surfactants. An alkali metal hydroxide can be optionally added to the alkaline mixture. Also claimed is the concentrated developing solution to be diluted to the desired strength.

27 Claims, No Drawings

AQUEOUS ALKALINE SOLUTION FOR DEVELOPING OFFSET PRINTING PLATES

This is a continuation of application Ser. No. 08/577,056, filed Dec. 22, 1995, now abandoned.

FIELD OF THE INVENTION

This invention relates to an aqueous alkaline solution for developing offset printing plate based on quinonediazide or diazo compounds.

BACKGROUND OF THE ART

Offset printing plates comprise ink receptive water repellant printing areas and water receptive, ink repellant, non-printing areas. The printing and non-printing areas are substantially coplanar. During printing, an aqueous media is applied to the plate. This media wets the non-printing areas, but is repelled by the printing areas. An oleophilic printing ink is applied and this ink is accepted by the printing areas but repelled by the wet non-printing areas. Ink is then transferred from the printing areas to the sheet to be printed.

The offset printing plates comprise a support and a radiation sensitive layer coated thereon. Aluminum plates are commonly employed as supports for offset printing plates. The radiation sensitive layer usually comprises a quinonediazide compound or a diazo compound as light-sensitive component.

The offset printing plate is imagewise exposed through a transparent film having opaque areas. A negative transparency of the desired image is used for exposing the negative-working offset printing plates, and a positive transparency of the desired image is used for exposing the positive-working offset printing plates. Accordingly, in the case of negative-working offset printing plates, the transparent areas of the negative transparency correspond to the image and radiation passing through these transparent areas causes a reaction in the light-sensitive layer that insolubilises the layer components (usually a diazo compound) in the image area. The image-wise exposed plate is then processed by selectively removing the non-image-wise exposed areas of the sensitive layer using a suitable developer. The image-wise exposed insolubilised areas remaining on the support after development constitutes the ink-receiving printing areas of the printing plate. On the contrary, in the case of positive-working offset printing plates, the transparent areas of the positive transparency correspond to the image and radiation passing through these transparent areas causes a reaction in the light-sensitive layer that solubilises the layer components (usually a quinonediazide compound) in the image area. The image-wise exposed plate is then processed by selectively removing the image-wise exposed areas of the sensitive layer using a suitable developer. The insoluble non-image-wise exposed areas remaining on the support after development constitutes the ink-receiving printing areas of the printing plate.

The solution employed to develop the image-wise exposed printing plate is usually an aqueous alkaline solution comprising alkali and having a high pH value (i.e., higher than 10). During development, the developing solution becomes exhausted by chemical reaction as development proceeds, and the solution needs to be replaced or replenished from time to time. Replacement or replenishment of the developing solution requires the developing process to stop, and this stop is particularly irksome when development is conducted in an automatic developer. Then, it would be preferable that the developing solution have as high an initial content of alkali as possible, so that exhaustion is not too fast.

However, the increase of the alkali content results in a corrosion of the aluminum support in the printing plate, which impairs the hydrophilic nature of the non-image areas and, accordingly, of the printing run length of the plate. Another problem relates to the formation of sludge, which can either foul the automatic developer or cause sludge deposition on the printing plate.

It is known in the art to use aqueous solutions of alkali silicates which exert only a small etching effect on metals and, at the same time, can have their developing capability controlled to some extent by adjusting the ratio of alkali oxide to silicon oxide, and by adjusting the concentration thereof. The higher the content of silicon oxide, the higher the development stability and the lower the developing ability. Conversely, the higher the content of alkali oxide, the lower the development stability and the higher the developing ability.

Accordingly, to obtain good developing stability at high alkali strength, various solutions have been proposed.

U.S. Pat. No. 4,606,995 discloses a developing solution comprising an alkali silicate content of from 1 to 10% by weight with a silicon oxide to alkali oxide ratio of from 0.5 to 3, and an alkali aqueous solution of a compound of a metal selected from the group consisting of Sn, Pb, Fe, Co, and Ni.

U.S. Pat. No. 4,500,625 discloses a developing solution comprising an alkali silicate content of from 1 to 10% by weight with a silicon oxide to alkali oxide ratio of from 0.5 to 3, and an organic boron compound.

U.S. Pat. No. 4,945,030 discloses a developing solution comprising an alkali content of from 12.5 to 17.5% by weight (in terms of sodium silicate and metasilicate) and an ethylene oxide-propylene oxide block copolymer.

Japanese Unexamined Patent Application 50/51324 discloses a developing solution comprising an alkali silicate content of from 1 to 10% by weight with a silicon oxide to alkali oxide ratio of from 0.5 to 3, and an anionic and/or amphoteric surfactant.

Japanese Unexamined Patent Application 55/95946 discloses a developing solution comprising an alkali silicate content of from 1 to 10% by weight with a silicon oxide to alkali oxide ratio of from 0.5 to 3, and a water soluble cationic polymer.

Japanese Unexamined Patent Application 56/142528 discloses a developing solution comprising an alkali silicate content of from 1 to 10% by weight with a silicon oxide to alkali oxide ratio of from 0.5 to 3, and a water soluble amphoteric macromolecular electrolyte.

However, all these methods a) provide a still unsatisfactory developing power in terms of square meters of material developed per liter of developer, b) cause undesirable foaming during development, and c) promote the formation of sludge, that can be deposited on the developed offset printing plate and/or within the automatic developing apparatus.

SUMMARY OF THE INVENTION

The present invention relates to an aqueous alkaline developing solution comprising an alkaline mixture of an alkali metal silicate and/or an alkali metal metasilicate, wherein the $M_2O/SiO_2$ molar ratio of said alkaline mixture is in the range of from 0.5 to 1.2, the total content of said alkaline mixture being in the range of from 6 to 15% by weight of the total developing solution, and wherein said developing solution comprises a non-ionic surfactant and at least another surfactant selected from the group consisting of anionic surfactants and amphoteric surfactants. An alkali metal hydroxide can be optionally added to the alkaline mixture.

DETAILED DESCRIPTION OF THE INVENTION

The present invention relates to an aqueous alkaline developing solution comprising an alkaline mixture of an alkali metal silicate and/or an alkali metal metasilicate, wherein the $M_2O/SiO_2$ molar ratio of said alkaline mixture is in the range of from 0.5 to 1.2, the total content of said alkaline mixture being in the range of from 6 to 13% by weight of the total developing solution, and wherein said developing solution further comprises a non-ionic surfactant and at least another surfactant selected from the group consisting of anionic surfactants and amphoteric surfactants.

The developing solution of the present invention comprises alkali metal silicate and/or metasilicate, such as, for example, potassium silicate, sodium silicate, lithium silicate, potassium metasilicate, sodium metasilicate, and lithium metasilicate, in an amount ranging from 6 to 15%, preferably from 8 to 12% by weight of the total developing solution.

In addition to the alkali metal silicate and/or metasilicate, the developing solution of the present invention can also comprise an alkali metal hydroxide, such as, for example, potassium hydroxide, sodium hydroxide, and lithium hydroxide, in an amount ranging from 0 to 5%, preferably from 0.1 to 1% by weight of the total developing solution.

The molar ratio between the alkali metal hydroxide (expressed as $M_2O$, wherein M is an alkali metal) and the alkali metal silicate and/or metasilicate (expressed as $SiO_2$) ranges from 0.5 to 1.2, preferably from 0.8 and 1.1. In calculating the $M_2O/SiO_2$ molar ratio, the value of $M_2O$ is obtained by the sum of both the contribution of the alkali metal silicate and/or metasilicate content, and the contribution of the alkali metal hydroxide content (if present).

The total content of the alkali metal silicate and/or metasilicate, and of the alkali metal hydroxide ranges from 6 to 15% by weight of the total developing solution, preferably from 8 to 13% by weight of the total developing solution.

Besides the components described above, the developing solution of the present invention comprises a non-ionic surfactant and at least another surfactant selected from the group consisting of anionic surfactants and amphoteric surfactants.

Examples of nonionic surfactants include ethoxylated alcohols, polyethylene glycols and polyhydric alcohols. Ethoxylated alcohols are preferred, and in particular ethoxylated alcohols having a hydrophilic-lipophilic balance (HLB) higher than 5 are more preferred.

Specific examples of nonionic surfactants are listed below: polyethylene glycol, polyoxyethylene glycol, lauryl ether, laurylalcohol polyglycol ethers, oleyl alcohol ethoxylated, lanolin alcohol ethoxylated, dodecanol ethoxylated, cetostearyl alcohol ethoxylated, tetramethyldecindiol ethoxylated, polyoxyethylene nonyl ether, polyoxyethylene cetyl ether, polyoxyethylene stearyl ether, polyoxyethylene oleyl ether, polyoxyethylene behenyl ether, polyoxyethylene polyoxypropylene block copolymers polymers, polyoxyethylene polyoxypropylene cetyl ether, polyoxyethylene polyoxypropylene behenyl ether, polyoxyethylene nonylphenyl ether, polyoxyethylene octylphenyl ether, polyoxyethylene stearylamine, polyoxyethylene oleylamine, polyoxyethylene stearic acid amide, polyoxyethylene oleic acid amide, polyoxyethylene castor oil, polyoxyethylene abietyl ether, polyoxyethylene lanolin ether, polyoxyethylene monolaurate, polyoxyethylene monostearate, polyoxyethylene glyceryl monooleate, polyoxyethylene glyceryl monostearate, polyoxyethylene propylene glycol monostearate, polyoxyethylene sorbitan monolaurate, and sorbitan monolaurate.

These non-ionic surfactants preferably have an average molecular weight ranging from 500 to 10,000, preferably from 1000 to 5000. They can be comprised individually or as admixture of two or more compounds in an amount ranging from 0.05 to 5%, preferably from 0.1 to 1% by weight of the total developing solution.

Exemplary anionic surfactants include salts of higher alcohol (C8-22) sulfate esters, such as, for example, sodium lauryl sulfate, sodium octyl sulfate, ammonium lauryl sulfate, and the like, salts of aliphatic alcohol phosphate esters, such as, for example, sodium cetyl alcohol phosphate, and the like, salts of alkylaryl phosphate esters, salts of alkylaryl sulfonic acids, such as, for example, sodium dodecylbenzene sulfonate, sodium isopropylnaphthalene sulfonate, sodium dinaphthalenedisulfonate, sodium m-nitrobenzene sulfonate, and the like, sulfonic acid salts of alkyl amides, and sulfonic acid salts of dibasic aliphatic acid esters, such as, for example, sodium dioctyl sulfosuccinate, sodium dihexyl sulfosuccinate, and the like.

These anionic surfactants preferably have an average molecular weight ranging from 500 to 10,000, preferably from 1000 to 5000. They can be comprised individually or as admixture of two or more compounds.

Exemplary amphoteric surfactants include betaine derivatives, such as, for example, alkylamidopropyl betaine, alkyldimethyl betaine, bishydroxyethyl betaine, alkylamido propyl betaine, lauryl betaine, and the like, glycine derivatives, such as, for example, cocoamphocarboxy glycinate, lauroamphocarboxy glycinate, caprylamphocarboxy glycinate, oleoamphocarboxy glycinate, oleoamphopolycarboxy glycinate, N-alkyl glycinate, and the like, imino derivatives, such as, for example, cocoiminodipropionate, octyliminodipropionate, and the like, imidazoline derivatives, such as, for example, coconut imidazoline, and the like, lecithin derivatives, and aminocarboxylic acids.

These amphoteric surfactants preferably have an average molecular weight ranging from 500 to 10,000, preferably from 1,000 to 5,000. They can be comprised individually or as admixture of two or more compounds.

The above described anionic and amphoteric surfactant can be present in the developing solution of the present invention in a total amount ranging from 0.5 to 10%, preferably from 1 to 6%, and more preferably from 1 to 3% by weight of the total developing solution.

Other examples of anionic, nonionic, and amphoteric surfactants can be found in McCutcheon's, Volume 1: "Emulsifiers & Detergents", International Edition, Manufacturing Confectioner Publishing Co., 175 Rock Rd., Glen Rock, N.J. 07452, USA.

The developing solution of the present invention can also comprises sequestering agents. Specific examples of sequestering agents are selected from the group consisting of aminopolycarboxylics acid and polyphosphonic acids as described, for example, in EP 286,874 and in Research Disclosure 18837. The amount of sequestering agents presents in the developing solution ranges from 0.5 to 10%, preferably from 1 to 6%, and more preferably from 1 to 3% by weight of the total developing solution. Exemplary compounds of aminopolycarboxylics are listed below.
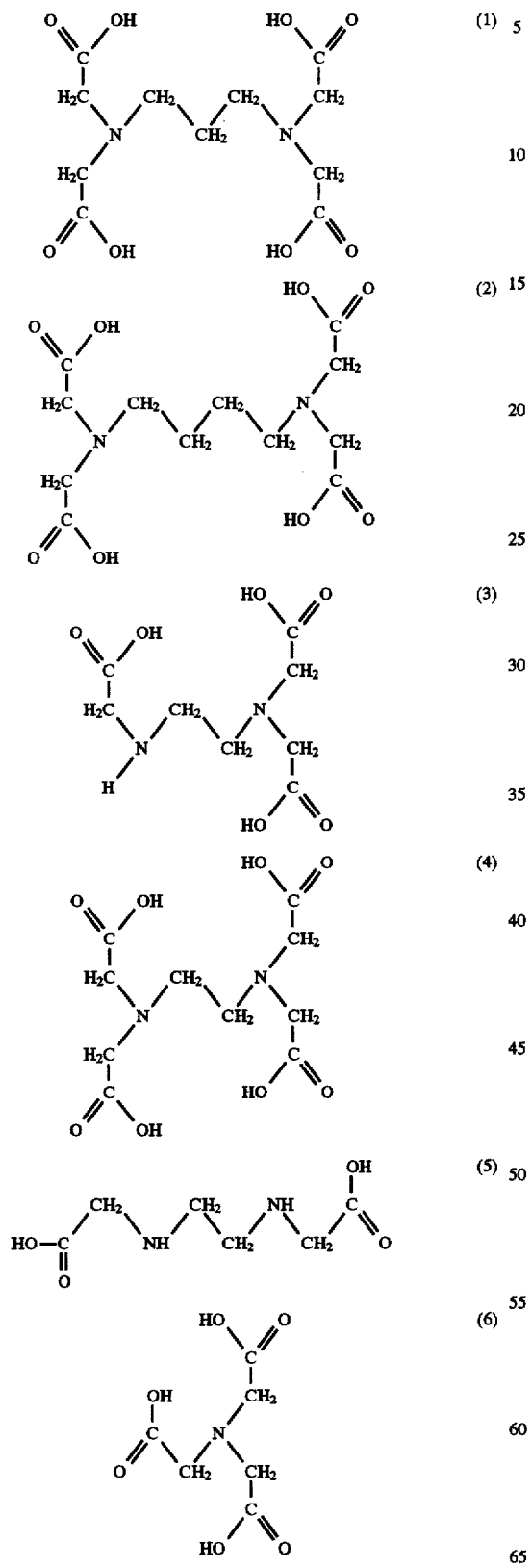
Exemplary compounds of polyphosphonic acids are listed below.
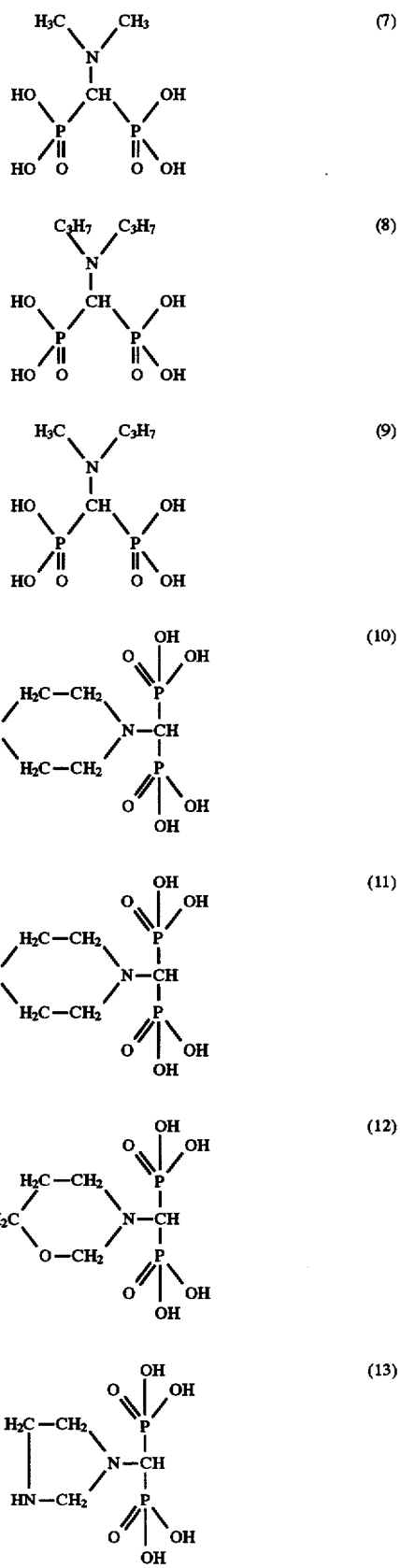

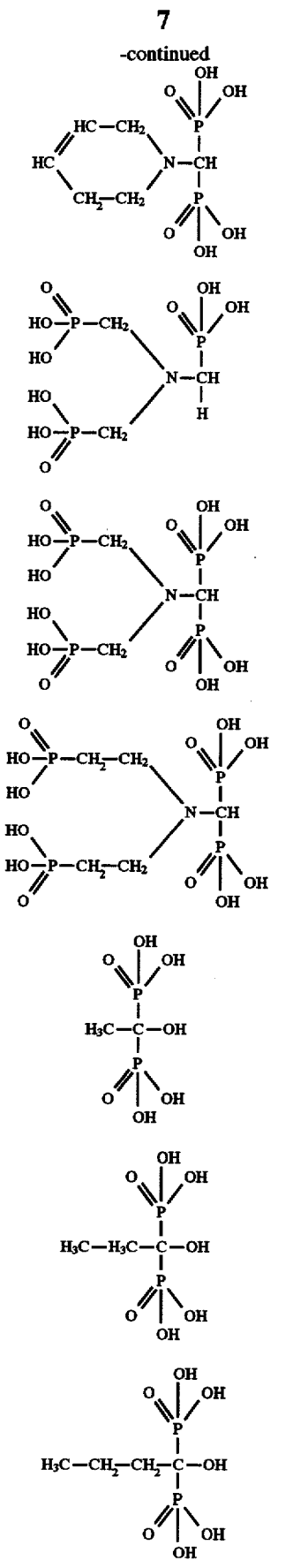
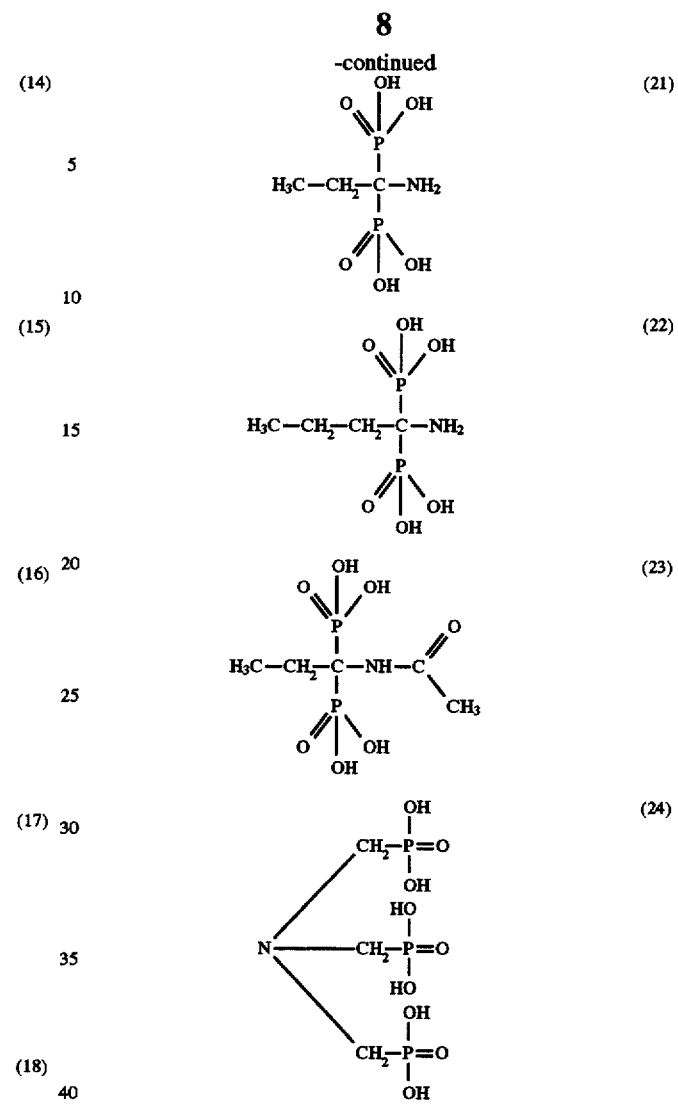

The developing solution of the present invention optionally comprises an anti-foaming agent to reduce the appearance of foam when used in automatic processing apparatus. Specific examples of antifoaming agents are SLE™, the tradename of a silicon antifoaming agent manufactured by Wacker AG, Triton™ DF-12, the tradename of a polyethoxylated alcohol manufactured by Union Carbide Co., Antarox™ B10, B25, B50, B75, and B100, the tradenames of polyoxyalkylated polyalkylene glycols manufactured by Rhone Poulenc. The antifoaming agents are present in an amount of from 0.01 to 3%, preferably from 0.01 to 1% by weight of the total developing solution.

The developing solution of the present invention can also comprises other additives such as, for example, organic solvents, reducing agents, aromatic carboxylic acids, and the like, as described, for example, in U.S. Pat. No. 3,110,596, 4,350,756, 4,366,224, 4,379,830, 4,500,625, 4,606,995, 4,945,030, and 5,234,796, EP 8,394, and JP 56/142,528.

The developing solution of the present invention may also be prepared in a concentrated form and then diluted to a working strength just prior to use. For example, a concentrated aqueous alkaline developing solution to be diluted with water in a mixing ratio equal to 1:3 can be prepared.

The following examples are provided with the aim of further illustrating the present invention, but are in no way to be considered as limiting.

EXAMPLES

A set of six aqueous alkaline developing solution were prepared according to the following Table 1.

TABLE 1

|  | A | B | C | D | E | F | G |
|---|---|---|---|---|---|---|---|
| Water | 87.25% | 84.22% | 84.22% | 84.15% | 84.22% | 83.93% | 93.72% |
| Sodium silicate | — | — | — | — | 1.75% | — | 3.74% |
| Potassium silicate | — | — | 6.25% | — | — | — | — |
| Sodium metasilicate | 8.00% | 10.65% | — | 11.00% | 9.25% | 11.00% | — |
| Sodium hydroxide | — | 0.35% | — | — | — | — | 2.45% |
| Potassium hydroxyde | — | — | 4.75% | — | — | — | — |
| Surfynol ™ 465 | 0.25% | 0.25% | 0.25% | 0.30% | 0.25% | 0.25% | 0.05% |
| Triton ™ H66 | 2.50% | 2.50% | 2.50% | 2.50% | — | 2.50% | — |
| Miratain ™ JC-HA | — | — | — | — | 2.50% | — | — |
| Antarox ™ B-25 | — | 0.02% | 0.02% | — | 0.02% | 0.02% | — |
| SLE ™ | — | 0.01% | 0.01% | — | 0.01% | — | — |
| Triton ™ DF-12 | — | — | — | — | — | 0.3% | — |
| Budex ™ 5103 | — | 2.00% | 2.00% | 2.00% | 2.00% | 2.00% | — |
| Hexametaphosphate | 2.00% | — | — | — | — | — | 0.09% |

Surfynol™ 465 is the tradename of a tetramethyldecindiol ethoxylated nonionic surfactant manufactured by Air Products & Chemicals Inc. (USA).

Triton™ H66 is the tradename of a potassium salt of an alkylarylalkoxy phosphate ester ionic surfactant manufactured by Union Carbide Co.

Miratain™ JC-HA is the trade name of an alkylimino propionate amphoteric surfactant manufactured by Rhone Poulenc Co.

Antarox™ B-25 is the tradename of an ethylene oxide-propylene oxide block copolymer manufactured by Rhone Poulenc Co.

SLE™ is the tradename of silicon antifoaming agent manufactured by Wacker Co.

Budex™ 5103 is the tradename of a polyphosphonic acid sequestering agent manufactured by Budenheim.

Triton™ DF-12 is the tradename of a polyethoxylated alcohol manufactured by Union Carbide Co.

A set of 3M PSM positive offset printing plates comprising an o-quinonediazide compound as light-sensitive agent and a set of 3M PCL convertible offset printing plates were exposed to light, and then developed at 22° C. for 25 seconds in a 3M 2082 automatic processor comprising the above described developing solutions A to F. The reduction of the developing power of the developing solution was measured by considering the photospeed of the printing plate with fresh developing solution and the photospeed after a certain number of plates had passed through the developing solution. The developing solution was considered exhausted when the plates showed a change in photospeed higher than one microline. The results are summarized in the following Table 2.

TABLE 2

| Developing Solution | Alkali content (% by weight) | $M_2O/SiO_2$ Molar Ratio | Developing power ($m^2/l$) | |
|---|---|---|---|---|
| | | | Positive plates | Convertible plates |
| A (Inv.) | 8.00 | 1.000 | — | 10 |
| B (Inv.) | 11.00 | 1.046 | 34 | 30 |
| C (Inv.) | 11.00 | 0.920 | 22 | 15 |
| D (Inv.) | 11.00 | 1.000 | — | 24 |

TABLE 2-continued

| Developing Solution | Alkali content (% by weight) | $M_2O/SiO_2$ Molar Ratio | Developing power ($m^2/l$) | |
|---|---|---|---|---|
| | | | Positive plates | Convertible plates |
| E (Inv.) | 11.00 | 0.872 | 23 | — |
| F (Inv.) | 11.00 | 1.000 | 30 | 24 |
| G (Comp.) | 6.19 | 0.950 | 11 | 7 |

The data of Table 2 clearly show the higher developing power of the developing composition of the present invention having regard comparison sample G. Additionally, all the compositions of the present invention give a photospeed of at least one microlines higher than the photospeed obtained with the comparison composition G.

A hard and adherent sludge was observed on the rolls and tank of the processor at the end of the exhaustion test by using the developing solution G. A reduced amount of sludge was observed by using developer composition A. Absence of sludge was observed by using developer compositions B to F. Further, the formation of foam is dramatically reduced by using developing compositions B, C, E and F.

Example 2

A set of two aqueous alkaline developing solution were prepared according to the following Table 3. All values are expressed as percent by weight of the total developing solution.

TABLE 3

|  | H | L |
|---|---|---|
| Water | 84.22 | 84.22 |
| Sodium silicate | 1.75 | 1.75 |
| Sodium metasilicate | 9.25 | 9.25 |
| Surfynol ™ 465 | 0.15 | 0.25 |
| Triton ™ H66 | 2.50 | 2.50 |
| Antarox ™ B-25 | 0.02 | 0.02 |
| Budex ™ 5103 | 2.00 | 2.00 |
| SLE ™ | 0.01 | 0.01 |

A set of 3M PSM positive offset printing plates comprising an o-quinonediazide compound as light-sensitive agent and a set of 3M PCL convertible offset printing plates were exposed to light, and then developed at 22° C. for 25 seconds in a 3M 2082 automatic processor comprising the above described developing solutions H and L.

The evaluation was performed as for Example 1. The results are summarized in the following Table 4.

TABLE 4

| Developing Solution | Alkali content (% by weight) | $M_2O/SiO_2$ Molar Ratio | Developing power ($m^2/l$) | |
|---|---|---|---|---|
| | | | Positive plates | Convertible plates |
| H (Inv.) | 11.00 | 0.872 | 22 | 16 |
| L (Inv.) | 11.00 | 0.872 | 22 | 16 |

Both positive and convertible plates developed with solution H showed a higher photospeed than that obtained with solution L. This test evidenced the influence of Surfinol[198] 465 on the photospeed of the developed plate. Surfynol™ 465 has a buffer effect on the developing capability of the aqueous alkaline developing solutions.

Example 3

A set of two aqueous alkaline developing solution were prepared according to the following Table 5. All values are expressed as percent by weight of the total developing solution.

TABLE 5

| | M | N |
|---|---|---|
| Water | 84.22 | 84.22 |
| Sodium silicate | 1.75 | 1.75 |
| Sodium metasilicate | 9.25 | 9.25 |
| Surfynol ™ 465 | 0.25 | 0.25 |
| Triton ™ H66 | 1.50 | 2.50 |
| Antarox ™ B-25 | 0.02 | 0.02 |
| Budex ™ 5103 | 2.00 | 2.00 |
| SLE ™ | 0.01 | 0.01 |

A set of 3M PSM positive offset printing plates comprising an o-quinonediazide compound as light-sensitive agent and a set of 3M PCL convertible offset printing plates were exposed to light, and then developed at 22° C. for 25 seconds in a 3M 2082 automatic processor comprising the above described developing solutions M and N.

The evaluation was performed as for Example 1. The results are summarized in the following Table 6.

TABLE 6

| Developing Solution | Alkali content (% by weight) | $M_2O/SiO_2$ Molar Ratio | Developing power ($m^2/l$) | |
|---|---|---|---|---|
| | | | Positive plates | Convertible plates |
| M (Inv.) | 11.0 | 0.872 | 22 | 16 |
| N (Inv.) | 11.0 | 0.872 | 22 | 16 |

After preparation, some persistent turbidity was evidenced by observing developing solution M, which comprises a lower amount of Triton™ H-66. The developing solution N was without turbidity and stable for this property with time.

Example 4

This example is useful to demonstrate the effect of polyphosphonic acid sequestering agents in reducing the sludge in automatic processors. A set of two aqueous alkaline developing solutions were prepared according to the following Table 7. All values are expressed as percent by weight of the total developing solution.

TABLE 7

| | O | P |
|---|---|---|
| Water | 87.22 | 87.22 |
| Sodium metasilicate | 8.00 | 8.00 |
| Surfynol ™ 465 | 0.25 | 0.25 |
| Triton ™ H66 | 2.50 | 2.50 |
| Antarox ™ B-25 | 0.02 | 0.02 |
| Budex ™ 5103 | 2.00 | — |
| Hexametaphosphate | — | 2.00 |
| Triton ™ DF-12 | 0.01 | 0.01 |

A set of 3M PSM positive offset printing plates comprising an o-quinonediazide compound as light-sensitive agent and a set of 3M PCL convertible offset printing plates were exposed to light, and then developed at 22° C. for 25 seconds in a 3M 2082 automatic processor comprising the above described developing solutions O and P.

The evaluation was performed as for Example 1. The results are summarized in the following Table 8.

TABLE 8

| Developing Solution | Alkali content (% by weight) | $M_2O/SiO_2$ Molar Ratio | Developing power ($m^2/l$) | |
|---|---|---|---|---|
| | | | Positive plates | Convertible plates |
| O (Inv.) | 8.0 | 1.000 | — | 11 |
| P (Inv.) | 8.0 | 1.000 | — | 10 |

The developing solution O showed a dramatically reduced amount of sludge even in comparison to developing solution P which is within the scope of the present invention.

I claim:

1. A method for developing a printing plate comprising quinonediazide or diazo compounds in a photosensitive layer, said method comprising imagewise exposing said printing plate, and then washing off more soluble areas of said photosensitive layer in an aqueous alkaline developing solution, wherein said aqueous alkaline developing solution comprising an alkaline composition of at least one compound selected from the group consisting of alkali metal silicate and alkali metal metasilicate, wherein the $M_2O/SiO_2$ molar ratio of said alkaline composition is in the range of from 0.5 to 1.2, the total content of said alkaline composition being in the range of from 6 to 15% by weight of total developing solution, and wherein said developing solution comprises a non-ionic surfactant and at least another surfactant selected from the group consisting of anionic surfactants and amphoteric surfactants.

2. The method of claim 1, wherein said alkaline mixture further comprises an alkali metal hydroxide.

3. The method of claim 1, wherein the $M_2O/SiO_2$ molar ratio of said alkaline mixture is in the range of from 0.8 to 1.1 and the total content of said alkaline mixture being in the range of from 8 to 13% by weight of the total developing solution.

4. The method of claim 1, wherein said non-ionic surfactant is selected from the group consisting of ethoxylated alcohols, polyethylene glycols and polyhydric alcohols.

5. The method of claim 1, wherein said non-ionic surfactant has an average molecular weight ranging from 500 to 10,000.

6. The method of claim 1, wherein said non-ionic surfactant is present in an amount ranging from 0.05 to 5% by weight of the total developing solution.

7. The method of claim 1, wherein said anionic surfactant is selected from the group consisting of higher alcohol sulfate esters, salts of aliphatic alcohol phosphate esters, salts of alkylaryl phosphate esters, salts of alkylaryl sulfonic acids, sulfonic acid salts of alkyl amides, and sulfonic acid salts of dibasic aliphatic acid esters.

8. The method of claim 1, wherein said anionic surfactant has an average molecular weight ranging from 500 to 10,000.

9. The method of claim 1, wherein said amphoteric surfactant is selected from the group consisting of betaines, glycines, imino compounds, imidazolines, lecithins, and aminocarboxylic acids.

10. The method of claim 1, wherein said amphoteric surfactant has an average molecular weight ranging from 500 to 10,000.

11. The method of claim 1, wherein said anionic and amphoteric surfactants are present in a total amount ranging from 0.5 to 10% by weight of the total developing solution.

12. The method of claim 1, wherein said developing solution further comprises a sequestering agent.

13. The method of claim 12, wherein said sequestering agent is selected from the group consisting of aminopolycarboxylics acid and polyphosphonic acids.

14. The method of claim 12, wherein said sequestering agent is present in an amount ranging from 0.5 to 10% by weight of the total developing solution.

15. The method of claim 1, wherein said developing solution further comprises an antifoaming agent.

16. The method of claim 15, wherein said anti-foaming agent is present in an amount ranging from 0.01 to 3% by weight of the total developing solution.

17. A method for developing a printing plate comprising quinonediazide or diazo compounds in a photosensitive layer, said method comprising imagewise exposing said printing plate, and then washing off more soluble areas of said photosensitive layer in an aqueous alkaline developing solution, wherein said aqueous alkaline developing solution is made from a concentrated aqueous alkaline developing solution by diluting said concentrated solution with water in a mixing ratio of 1 to 3 to form a ready-to-use aqueous alkaline developing solution comprising an alkaline composition of at least one compound selected from the group consisting of alkali metal silicate and alkali metal metasilicate, wherein the $M_2O/SiO_2$ molar ratio of said alkaline composition is in the range of from 0.5 to 1.2, the total content of said alkaline composition being in the range of from 6 to 15% by weight of total developing solution, and wherein said developing solution comprises a non-ionic surfactant and at least another surfactant selected from the group consisting of anionic surfactants and amphoteric surfactants.

18. The method of claim 1, wherein said amphoteric surfactant is selected from the group consisting of betaines, glycines, imidazolines, and aminocarboxylic acids.

19. The method of claim 1 wherein said molar ratio is between 0.8 and 1.1.

20. The method of claim 2 wherein said molar ratio is between 0.8 and 1.1.

21. The method of claim 17 wherein said non-ionic surfactant is selected from the group consisting of ethoxylated alcohols, polyethylene glycols and polyhydric alcohols.

22. The method of claim 1 wherein said non-ionic surfactant is selected from the group consisting of polyethylene glycol, polyoxyethylene glycol, lauryl ether, laurylalcohol polyglycol ethers, oleyl alcohol ethoxylated, lanolin alcohol ethoxylated, dodecanol ethoxylated, cetostearyl alcohol ethoxylated, tetramethyldecindiol ethoxylated, polyoxyethylene nonyl ether, polyoxyethylene cetyl ether, polyoxyethylene stearyl ether, polyoxyethylene oleyl ether, polyoxyethylene behenyl ether, polyoxyethylene polyoxypropylene block copolymers, polyoxyethylene polyoxypropylene cetyl ether, polyoxyethylene polyoxypropylene behenyl ether, polyoxyethylene nonylphenyl ether, polyoxyethylene octylphenyl ether, polyoxyethylene stearylamine, polyoxyethylene oleylamine, polyoxyethylene stearic acid amide, polyoxyethylene oleic acid amide, polyoxyethylene castor oil, polyoxyethylene abietyl ether, polyoxyethylene lanolin ether, polyoxyethylene monolaurate, polyoxyethylene monostearate, polyoxyethylene glyceryl monooleate, polyoxyethylene glyceryl monostearate, polyoxyethylene propylene glycol monostearate, polyoxyethylene sorbitan monolaurate, and sorbitan monolaurate.

23. The method of claim 17 wherein said non-ionic surfactant is selected from the group consisting of polyethylene glycol, polyoxyethylene glycol, lauryl ether, laurylalcohol polyglycol ethers, oleyl alcohol ethoxylated, lanolin alcohol ethoxylated, dodecanol ethoxylated, cetostearyl alcohol ethoxylated, tetramethyldecindiol ethoxylated, polyoxyethylene nonyl ether, polyoxyethylene cetyl ether, polyoxyethylene stearyl ether, polyoxyethylene oleyl ether, polyoxyethylene behenyl ether, polyoxyethylene polyoxypropylene cetyl ether, polyoxyethylene polyoxypropylene behenyl ether, polyoxyethylene nonylphenyl ether, polyoxyethylene octylphenyl ether, polyoxyethylene stearylamine, polyoxyethylene oleylamine, polyoxyethylene stearic acid amide, polyoxyethylene oleic acid amide, polyoxyethylene castor oil, polyoxyethylene abietyl ether, polyoxyethylene lanolin ether, polyoxyethylene monolaurate, polyoxyethylene monostearate, polyoxyethylene glyceryl monooleate, polyoxyethylene glyceryl monostearate, polyoxyethylene propylene glycol monostearate, polyoxyethylene sorbitan monolaurate, and sorbitan monolaurate.

24. The method of claim 2 wherein said non-ionic surfactant is selected from the group consisting of polyethylene glycol, polyoxyethylene glycol, lauryl ether, laurylalcohol polyglycol ethers, oleyl alcohol ethoxylated, lanolin alcohol ethoxylated, dodecanol ethoxylated, cetostearyl alcohol ethoxylated, tetramethyldecindiol ethoxylated, polyoxyethylene nonyl ether, polyoxyethylene cetyl ether, polyoxyethylene stearyl ether, polyoxyethylene oleyl ether, polyoxyethylene behenyl ether, polyoxyethylene polyoxypropylene cetyl ether, polyoxyethylene polyoxypropylene behenyl ether, polyoxyethylene nonylphenyl ether, polyoxyethylene octylphenyl ether, polyoxyethylene stearylamine, polyoxyethylene oleylamine, polyoxyethylene stearic acid amide, polyoxyethylene oleic acid amide, polyoxyethylene castor oil, polyoxyethylene abietyl ether, polyoxyethylene lanolin ether, polyoxyethylene monolaurate, polyoxyethylene monostearate, polyoxyethylene glyceryl monooleate, polyoxyethylene glyceryl monostearate, polyoxyethylene propylene glycol monostearate, polyoxyethylene sorbitan monolaurate, and sorbitan monolaurate.

25. The method of claim 18 wherein said non-ionic surfactant is selected from the group consisting of polyethylene glycol, polyoxyethylene glycol, lauryl ether, laurylalcohol polyglycol ethers, oleyl alcohol ethoxylated, lanolin alcohol ethoxylated, dodecanol ethoxylated, cetostearyl alcohol ethoxylated, tetramethyldecindiol ethoxylated, polyoxyethylene nonyl ether, polyoxyethylene cetyl ether, polyoxyethylene stearyl ether, polyoxyethylene oleyl ether, polyoxyethylene behenyl ether, polyoxyethylene polyoxypropylene cetyl ether, polyoxyethylene polyoxypropylene behenyl ether, polyoxyethylene nonylphenyl ether, polyoxyethylene octylphenyl ether, polyoxyethylene stearylamine, polyoxyethylene oleylamine, polyoxyethylene stearic acid amide, polyoxyethylene oleic acid amide, polyoxyethylene castor oil, polyoxyethylene abietyl ether, polyoxyethylene lanolin ether, polyoxyethylene monolaurate, polyoxyethylene monostearate, polyoxyethylene glyceryl monooleate, polyoxyethylene glyceryl monostearate, polyoxyethylene propylene glycol monostearate, polyoxyethylene sorbitan monolaurate, and sorbitan monolaurate.

26. The method of claim 19 wherein said non-ionic surfactant is selected from the group consisting of polyethylene glycol, polyoxyethylene glycol, lauryl ether, laurylalcohol polyglycol ethers, oleyl alcohol ethoxylated, lanolin alcohol ethoxylated, dodecanol ethoxylated, cetostearyl alcohol ethoxylated, tetramethyldecindiol polyethoxylated, polyoxyethylene nonyl ether, polyoxyethylene cetyl ether, polyoxyethylene stearyl ether, polyoxyethylene oleyl ether, polyoxyethylene behenyl ether, polyoxyethylene polyoxypropylene cetyl ether, polyoxyethylene polyoxypropylene behenyl ether, polyoxyethylene nonylphenyl ether, polyoxyethylene octylphenyl ether, polyoxyethylene stearylamine, polyoxyethylene oleylamine, polyoxyethylene stearic acid amide, polyoxyethylene oleic acid amide, polyoxyethylene castor oil, polyoxyethylene abietyl ether, polyoxyethylene lanolin ether, polyoxyethylene monolaurate, polyoxyethylene monostearate, polyoxyethylene glyceryl monooleate, polyoxyethylene glyceryl monostearate, polyoxyethylene propylene glycol monostearate, polyoxyethylene sorbitan monolaurate, and sorbitan monolaurate.

27. The method of claim 20 wherein said non-ionic surfactant is selected from the group consisting of polyethylene glycol, polyoxyethylene glycol, lauryl ether, laurylalcohol polyglycol ethers, oleyl alcohol ethoxylated, lanolin alcohol ethoxylated, dodecanol ethoxylated, cetostearyl alcohol ethoxylated, tetramethyldecindiol ethoxylated, polyoxyethylene nonyl ether, polyoxyethylene cetyl ether, polyoxyethylene stearyl ether, polyoxyethylene oleyl ether, polyoxyethylene behenyl ether, polyoxyethylene polyoxypropylene cetyl ether, polyoxyethylene polyoxypropylene behenyl ether, polyoxyethylene nonylphenyl ether, polyoxyethylene octylphenyl ether, polyoxyethylene stearylamine, polyoxyethylene oleylamine, polyoxyethylene stearic acid amide, polyoxyethylene oleic acid amide, polyoxyethylene castor oil, polyoxyethylene abietyl ether, polyoxyethylene lanolin ether, polyoxyethylene monolaurate, polyoxyethylene monostearate, polyoxyethylene glyceryl monooleate, polyoxyethylene glyceryl monostearate, polyoxyethylene propylene glycol monostearate, polyoxyethylene sorbitan monolaurate, and sorbitan monolaurate.

* * * * *